(12) United States Patent
Small et al.

(10) Patent No.: US 12,078,788 B2
(45) Date of Patent: Sep. 3, 2024

(54) VARIABLE MAGNIFICATION AFOCAL TELESCOPE ELEMENT

(71) Applicant: nLIGHT, Inc., Camas, WA (US)

(72) Inventors: Jay Small, Vancouver, WA (US);
Zhigang Chen, Portland, OR (US);
Manoj Kanskar, Portland, OR (US)

(73) Assignee: nLIGHT, Inc., Camas, WA (US)

( * ) Notice: Subject to any disclaimer, the term of this patent is extended or adjusted under 35 U.S.C. 154(b) by 206 days.

(21) Appl. No.: 17/634,914

(22) PCT Filed: Aug. 14, 2020

(86) PCT No.: PCT/US2020/046443
§ 371 (c)(1),
(2) Date: Feb. 11, 2022

(87) PCT Pub. No.: WO2021/030721
PCT Pub. Date: Feb. 18, 2021

(65) Prior Publication Data
US 2022/0382028 A1 Dec. 1, 2022

Related U.S. Application Data

(60) Provisional application No. 62/886,912, filed on Aug. 14, 2019, provisional application No. 62/886,907, filed on Aug. 14, 2019.

(51) Int. Cl.
*G02B 19/00* (2006.01)
*G02B 6/42* (2006.01)
(Continued)

(52) U.S. Cl.
CPC ....... *G02B 19/0014* (2013.01); *G02B 6/4206* (2013.01); *G02B 19/0057* (2013.01);
(Continued)

(58) Field of Classification Search
None
See application file for complete search history.

(56) References Cited

U.S. PATENT DOCUMENTS

| 6,240,116 B1 | 5/2001 | Lang et al. |
| 7,061,690 B1 | 1/2006 | Berger |

(Continued)

FOREIGN PATENT DOCUMENTS

| CN | 1276064 | 12/2000 |
| CN | 1553244 | 12/2004 |

(Continued)

OTHER PUBLICATIONS

International Search Report and Written Opinion for related International Application No. PCT/US2020/046440, 7 pages, mailed Oct. 29, 2020.

(Continued)

*Primary Examiner* — Jerry Rahll
(74) *Attorney, Agent, or Firm* — Wiley Rein LLP

(57) ABSTRACT

Apparatus include a transmissive optical substrate configured to receive a plurality of laser beams propagating along respective parallel beam axes at respective initial beam displacements with respect to an optical axis of the transmissive optical substrate, and configured to produce laser output beams having reduced displacements, wherein the transmissive optical substrate includes first and second surfaces with respective first and second curvatures defined to increase an output beam magnification and to nonlinearly increase an output beam displacement from the optical axis for a linearly increasing input beam displacement from the optical axis.

17 Claims, 3 Drawing Sheets

(51) Int. Cl.
   *G02B 27/09* (2006.01)
   *G02B 27/30* (2006.01)
   *H01S 5/02315* (2021.01)
   *H01S 5/40* (2006.01)

(52) U.S. Cl.
   CPC ......... *G02B 27/0905* (2013.01); *G02B 27/30* (2013.01); *H01S 5/02315* (2021.01); *H01S 5/4012* (2013.01); *H01S 5/4025* (2013.01)

(56) References Cited

U.S. PATENT DOCUMENTS

| | | |
|---|---|---|
| 2004/0174604 A1 | 9/2004 | Brown |
| 2007/0053066 A1 | 3/2007 | Mitra |
| 2007/0195850 A1 | 8/2007 | Schluter et al. |
| 2007/0237455 A1 | 10/2007 | Sonoda |
| 2009/0129420 A1 | 5/2009 | Regaard et al. |
| 2011/0019710 A1 | 1/2011 | Strohmaier et al. |
| 2015/0362739 A1 | 12/2015 | Zambuto et al. |
| 2016/0161751 A1 | 6/2016 | Kiontke et al. |
| 2016/0274368 A1 | 9/2016 | Gurevich |
| 2017/0235057 A1* | 8/2017 | Hemenway ........ G02B 27/0966 385/24 |
| 2022/0385043 A1 | 12/2022 | Chen et al. |

FOREIGN PATENT DOCUMENTS

| | | |
|---|---|---|
| CN | 1885094 | 12/2006 |
| CN | 105700279 | 6/2016 |
| CN | 105759411 | 7/2016 |
| EP | 0723834 | 7/1996 |
| EP | 3035119 | 6/2016 |
| GB | 1530066 | 10/1978 |
| WO | WO 2004/047239 | 6/2004 |
| WO | WO2015/086425 | 6/2015 |

OTHER PUBLICATIONS

International Search Report and Written Opinion for related International Application No. PCT/US2020/046443, 6 pages, mailed Nov. 5, 2020.

* cited by examiner $$Z = \frac{cy^2}{1+\sqrt{1-(1+k)c^2y^2}} + \sum_{i=1}^{2}(A_i y^{2i})$$

Key

| S1 | asphere | | |
|---|---|---|---|
| | c | = | 0.278 ± 0.004 |
| | k | = | -0.92 ± 0.03 |
| | A1 | = | 0.227 |
| | A2 | = | 0 |
| S2 | asphere | | |
| | c | = | -0.333 ± 0.003 |
| | k | = | -8.0 ± .03 |
| | A1 | = | -0.195 |
| | A2 | = | -1.92 E-3 |

- Slope tolerance = 0.8'
  Slope integration length = 1
  Spatial sampling resolution = 0.15

VARIABLE MAGNIFICATION AFOCAL TELESCOPE ELEMENT

CROSS-REFERENCE TO RELATED APPLICATIONS

This is the U.S. National Stage of International Application No. PCT/US2020/046443, filed Aug. 14, 2020, which was published in English under PCT Article 21(2), which in turn claims the benefit of U.S. provisional application 62/886,912, filed Aug. 14, 2019. This application also claims the benefit of U.S. provisional application 62/886,907 entitled "HIGH BRIGHTNESS FIBER COUPLED DIODE LASERS WITH CIRCULARIZED BEAMS" also filed Aug. 14, 2019. These applications are incorporated by reference herein.

This application is related to U.S. application Ser. No. 15/435,117 filed Feb. 16, 2017 (and issued as U.S. Pat. No. 10,261,261), which is incorporated herein by reference.

FIELD

The field is afocal telescopes and laser diode beam combining.

BACKGROUND

There is a great demand for fiber-coupled high-power, high-brightness diode lasers for applications such as fiber laser pumping and materials processing. In existing fiber-coupled laser diode package devices, multiple single-emitter diode lasers emit respective beams that are stacked in the fast axis to achieve power scaling and brightness improvement. However, additional improvements to brightness are desirable for at least the above mentioned applications.

SUMMARY

Apparatus and methods involve afocal telescope elements that can be used to impart a variable magnification to exiting diode laser beams based on incident diode laser beam position.

According to an aspect of the disclosed technology, apparatus include a transmissive optical substrate configured to receive a plurality of laser beams propagating along respective parallel beam axes at respective initial beam displacements with respect to an optical axis of the transmissive optical substrate, and configured to produce laser output beams having reduced displacements, wherein the transmissive optical substrate includes first and second surfaces with respective first and second curvatures defined to increase an output beam magnification for an increasing input beam displacement from the optical axis. In some examples, the first and second curvatures are defined to nonlinearly increase an output beam displacement from the optical axis for a linearly increasing input displacement from the optical axis. In any preceding example, at least one of the first and second curvatures is hyperbolic. In any preceding example, the second curvature is hyperbolic concave. In any preceding examples, the first curvature is parabolic convex. In any preceding example, the first and second curvatures are aspheric. In any preceding example, the initial beam displacements correspond to displacements along a common fast axis of the laser beams. In some examples, the first and second curvatures are configured to circularize an ensemble image space and NA space of the laser output beams at an ensemble coupling plane by elongating images at the ensemble coupling plane along the common fast axis for laser output beams having smaller input beam displacements relative to the optical axis and shortening images at the ensemble coupling plane along the common fast axis for laser output beams having larger input beam displacements relative to the optical axis. In any preceding example, the transmissive optical substrate is a cylindrical meniscus lens. In some examples, the cylindrical meniscus lens includes a reference surface extending parallel to the optical axis and cylindrical axes associated with the first and second surfaces. In any preceding example, the first and second curvatures define a variable curvature ratio between parallel input beam positions and transmitted parallel output beam positions associated with the increased output beam magnification. Any preceding example can further include an objective lens configured to receive the laser output beams from the transmissive optical substrate and to focus the plurality of laser output beams at an ensemble coupling plane, and an optical fiber including an endface configured to receive the laser output beams at the ensemble coupling plane, wherein the transmissive optical substrate is configured to circularize an ensemble image space and NA space of the laser output beams at the ensemble coupling plane based on the increasing output beam magnification and the nonlinearly increasing output beam displacement. In any preceding example, the output beam magnification is less than one for each of the laser beams received within an input aperture of the transmissive optical substrate. In any preceding example, the transmissive optical substrate comprises a cylindrical fast axis telescope. In any preceding example, the transmissive optical substrate comprises a slow axis telescope. In any preceding example, the transmissive optical substrate comprises a combined fast and slow axis telescope. Apparatus can include laser diode packages that include the transmissive optical substrate of any preceding example. Methods can include making a transmissive optical substrate of any preceding example.

The foregoing and other objects, features, and advantages of the disclosed technology will become more apparent from the following detailed description, which proceeds with reference to the accompanying figures.

DETAILED DESCRIPTION

Laser diode packages typically couple laser diode beams emitted from rectangular diode facets into a circular fibers. This leads to unused spatial and angular laser properties associated with laser diode ensembles optically and physically arranged for fiber coupling at ensemble coupling planes (such as fiber input faces). There is a significant problem associated with the laser diodes' rectangular high aspect ratio in both physical and angular space and the mismatch with the circular space of the fiber. The circular spaces of the fiber can be more completely filled by varying laser diode chip geometries or varying FAC lenses for different laser diodes but such approaches are not typically cost effective.

By using one or more variable afocal telescope examples described herein, channel specific optics or layouts can be reduced or avoided, by providing variable magnification of a collimated beam. When applied to a laser diode package to angularly and spatially circularize its aggregate beam, individual diode channels can receive specific different magnifications based on, for example, their particular NA space juxtaposition or arrangement. This varying magnification varies their vertical physical dimension at focus, which can allow a net higher compression of the aggregate beam space so that, for example, additional laser channels can be added within the same NA of the fiber input.

Monolithic telescope optics typically provide a single-magnification ratio associated with surfaces of differing but constant curvatures. Alternatively, the surfaces are made aspheric to reduce spherical aberration across its clear aperture. In some examples herein, a variable magnification can be provided with a variable afocal telescope, allowing an increase of output brilliance (i.e., radiance) by up to 22% in various laser diode packages examples. For example, a fiber-coupled laser diode package that uses eighteen single-emitter laser diodes to generate beams and optics to couple the beams into a 0.15 NA 105 μm output fiber can instead use twenty-two single-emitter laser diodes of the same type to generate beams and use optics (including the variable afocal telescope) to couple the beams into the same 0.15 NA 105 μm output fiber.

Figure 1:
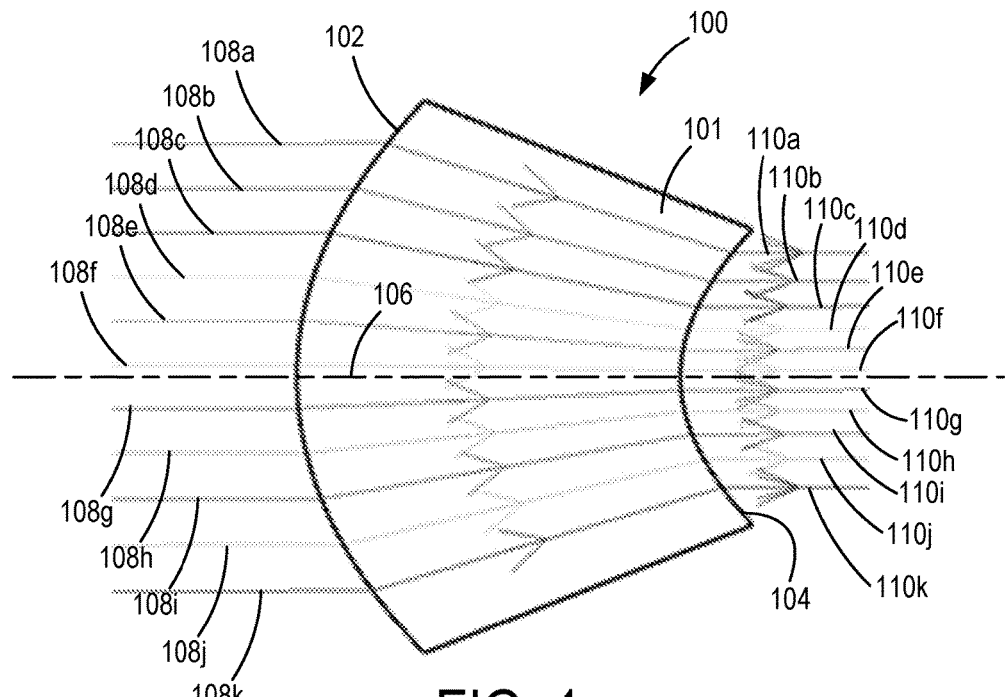
FIG. 1 is side view schematic and ray trace of an example variable afocal telescope.

FIG. 1 shows a physical form factor and surface shape for an example afocal telescope 100. The afocal telescope 100 includes a transmissive optical substrate 101 having a first surface 102 that is convex and a second surface 104 that is concave, each having respective curvatures defined thereon. The transmissive optical substrate 101 can be made of different materials, or have portions with different materials, including glasses, plastics, fused silica, transparent crystalline or non-crystalline materials. The curvatures for the first and second surfaces 102, 104 can be symmetric across an optical axis 106 of the afocal telescope 100 in the plane of FIG. 1. In representative examples, the afocal telescope 100 is a unitary cylindrical meniscus lens, with the cylindricity associated with a lack of a rotational symmetry about the optical axis 106 (such as with a spherical lens) rather than constant curvatures of cylinders. In additional examples, separate lens elements spaced apart from each other can be used to form a non-unitary lens or separate lens elements can be joined together to form a unitary lens having a plurality of elements. One or both of the first and second surfaces 102, 104 can have a hyperbolic shape. As shown, the first surface 102 has a parabolic shape and the second surface 104 has a hyperbolic shape. The shapes can define higher curvature pairs (magnification) near the center (e.g., closer to the optical axis 106) and more gradual curvatures near the edges of aperture of the afocal telescope 100. In further examples, afocal telescopes can be configured to provide variable slow axis magnifications or can have complex shapes configured to provide both variable fast and slow axis magnifications.

FIG. 1 also shows a plurality of input beam axes 108a-108k that are parallel to each other and parallel to the optical axis 106. Each of the input beam axes 108a-108k can be associated with a laser diode beam that is collimated in both a fast axis dimension and a slow axis dimension. With the adjacent arranged parallel input beam axes 108a-108k, the afocal telescope 100 is configured as a fast axis telescope such that a common fast axis of the laser diode beams generally extends perpendicular to the optical axis 106 in the plane of FIG. 1 (e.g., up and down). Following the ray trace, the laser diode beams propagate through the substrate 101 and become compressed to propagate along output beam axes 110a-110k, with the distance between the two outer output beam axes 110a, 110k being shorter than the distance between the two outer input beam axes 108a, 108k.

As shown, the input beam axes 108-108k have displacements from each other forming an even spacing. In representative examples, based on the selected curvatures of the first and second surfaces 102, 104, the compressed output beam axes 110a-110k are not evenly spaced. Instead, as the displacement distance from the optical axis 106 increases, adjacent output beam axes are increasingly displaced from each other, so that displacement between output beam axes 110e, 110f is smaller than the displacement between output beam axes 110d, 110e, which is smaller than the displacement between output beam axes 110c, 110d, which is smaller than the displacement between output beam axes 110b, 110c, which is smaller than the displacement between output beam axes 110a, 110b, etc. Thus, a linear input spacing can produce a variable output spacing, such that a linearly increasing (e.g., an even spacing) input beam displacement from the optical axis 106 produces a nonlinear increase (e.g., a non-even spacing) in output beam displacement. Based on the curvature symmetries across the optical axis 106, a similar effect is achieved below the optical axis 106 in FIG. 1, so that displacement between output beam axes 110g, 110h is smaller than the displacement between output beam axes 110h, 110i, which is smaller than the displacement between output beam axes 110i, 110j, which is smaller than the displacement between output beam axes 110j, 110k, etc.

Figure 2:
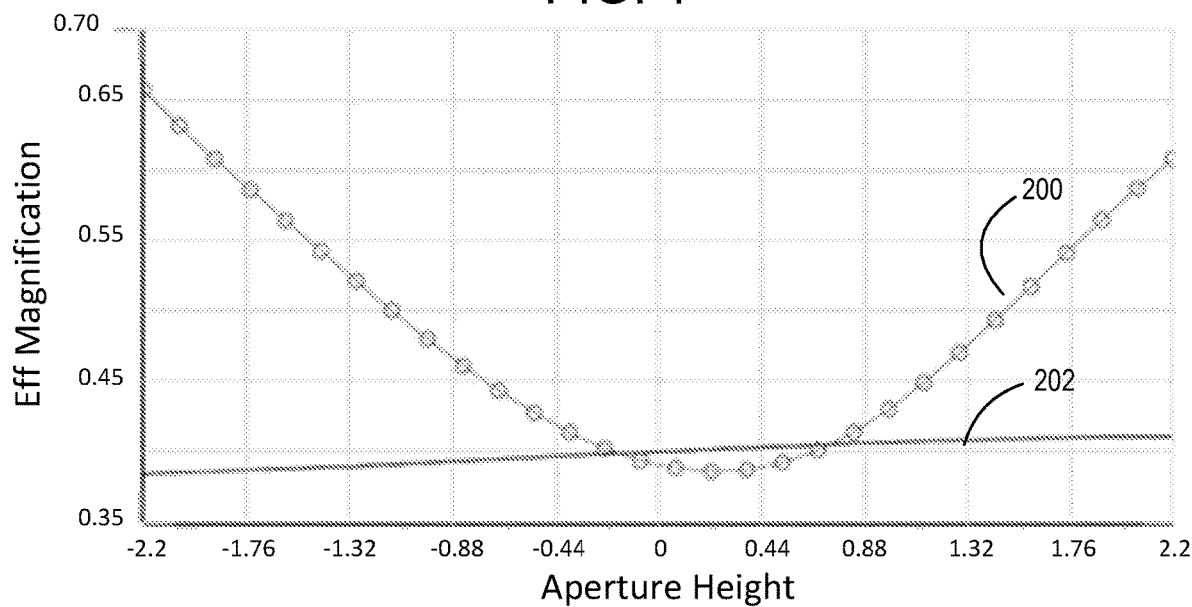
FIG. 2 is graph of magnification with respect to aperture height, for the variable afocal telescope example shown in FIG. 1, and for a non-variable afocal telescope that can be used in laser diode packages.
Figure 3A:
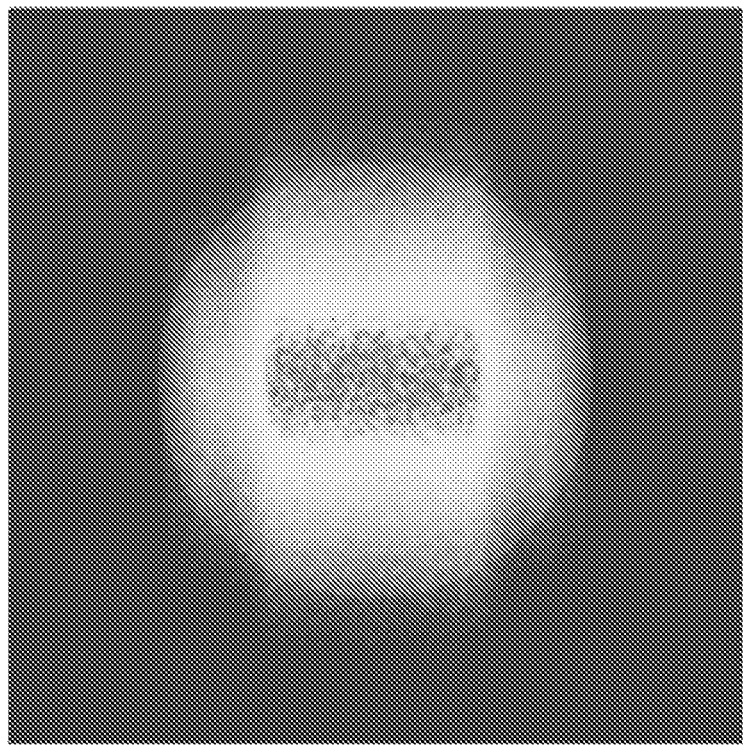
FIG. 3A is a modeled image of laser diode beam spots focused at a fiber input face, using a variable afocal telescope.
Figure 3B:
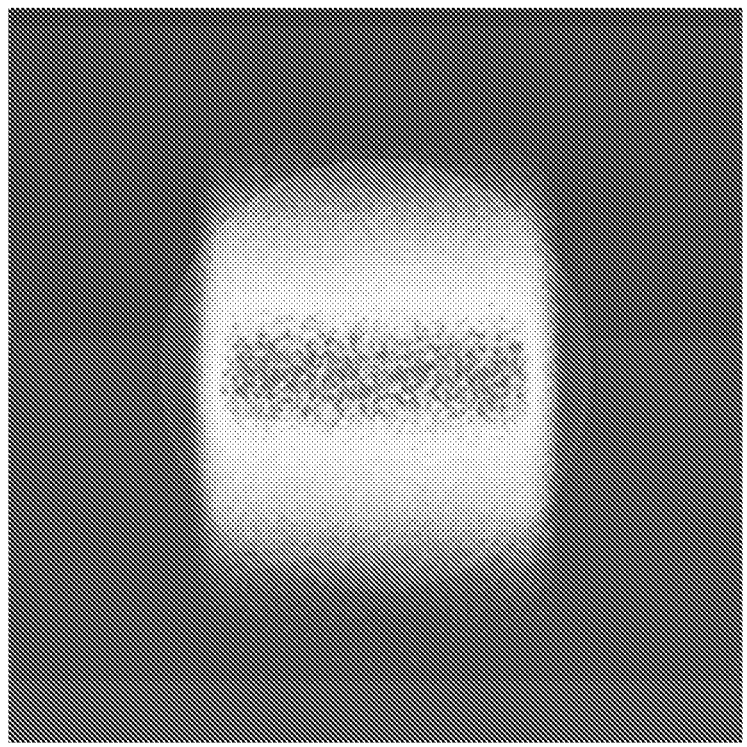
FIG. 3B is a modeled image of laser diode beam spots focused at a fiber input face, using a non-variable afocal telescope (or without a telescope).

In representative examples, for laser diode beams propagating along the input beam axes 108a-108k with a common cross-sectional shape (e.g., each having identical area and aspect ratio), the afocal telescope 100 introduces a variable magnification for the laser diode beams propagating along the output beam axes 110a-110k that is dependent on the displacement distance of the respective input beam axes 108a-108k from the optical axis 106. For example, with reference to FIG. 2, a variable magnification can be produced, plotted along magnification line 200, such that for an increasing distance from the optical axis 106, a magnification increases for a transmitted laser diode beam. For comparison, a magnification line 202 shows the flat magnification of an afocal telescope that does not provide a variable magnification. Thus, the laser diode beams propagating along input beam axes 108a, 108k are compressed in the fast axis direction by a smaller amount than the laser diode beams propagating along input beam axes 108f, 108g. The reduced compression for laser diode beams propagating along input beam axes 108a, 108k produces a smaller spot size in physical space in the fast axis direction at a subsequent coupling plane (such as an optical fiber) after propagation through an objective lens. In contrast, the increased compression for laser diode beams propagating along input beam axes 108f, 108g produces a larger spot size in physical space in the fast axis direction at the subsequent coupling plane after propagation through the objective lens. By selecting slow axis magnification separately, the laser diode beams propagating along input beam axes 108f, 108g can have the larger fast axis image dimension at the coupling plane and a smaller slow axis image dimension at the coupling plane, and the laser diode beams propagating along input beam axes 108a, 108k can have the smaller fast axis image dimension at the coupling plane and a larger slow axis image dimension at the coupling plane. A resulting ensemble or aggregate beam image in physical space is shown in FIG. 3A. The different aspect ratios for the different laser diode beams are imaged on the fiber to produce a circularized ensemble image in physical space. FIG. 3B shows an example of an ensemble beam image in which beams do not propagate through an afocal telescope providing variable magnification, resulting in a square shaped image as each beam images a common overlapping area. By introducing the variable spacing and variable magnification among the output beam axes 110a-110k with the afocal telescope 100, additional laser diode beams can be focused at the coupling plane, increasing coupled brightness.

Figures 4A, 4B:
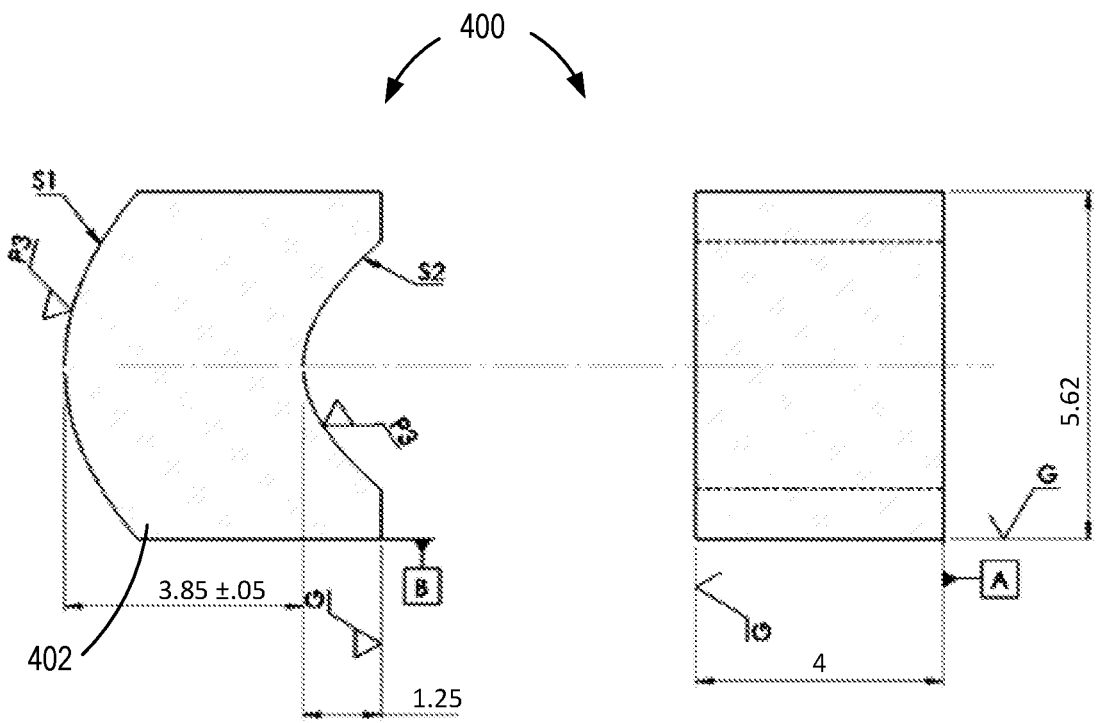
FIG. 4A are side and end views of an example fast axis telescope.
FIG. 4B is a SAG equation and associated coefficients for the example fast axis telescope in FIG. 4A.

FIG. 4A shows another example of an afocal telescope 400 configured to provide variable magnification, with FIG. 4B including the sag equation and suitable coefficients for surfaces S1, S2. The coefficients generally define the surface S1 as a parabolic or elliptical with k being close to −1, and the surface S2 as a hyperboloid with k<−1. As shown, the afocal telescope 400 includes a flat reference surface 402, which can be used to register the afocal telescope 400 to a base of a laser diode package housing so as to improve alignability with a plurality of laser diode beams directed through an interior of the laser diode package.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods which function in the manner described by such theories of operation.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope of the appended claims.

We claim:

1. An apparatus, comprising:
a transmissive optical substrate configured to receive a plurality of laser beams propagating along respective parallel beam axes at respective initial beam displacements with respect to an optical axis of the transmissive optical substrate, and configured to produce laser output beams having reduced displacements, wherein the transmissive optical substrate includes first and second surfaces with respective first and second curvatures defined to increase an output beam magnification for an increasing input beam displacement from the optical axis,
wherein at least one of the first and second curvatures is hyperbolic.

2. The apparatus of claim 1, wherein the first and second curvatures are defined to nonlinearly increase an output beam displacement from the optical axis for a linearly increasing input displacement from the optical axis.

3. The apparatus of claim 2, further comprising:
an objective lens configured to receive the laser output beams from the transmissive optical substrate and to focus the laser output beams at an ensemble coupling plane; and
an optical fiber including an endface configured to receive the laser output beams at the ensemble coupling plane;
wherein the transmissive optical substrate is configured to circularize an ensemble image space and NA space of the laser output beams at the ensemble coupling plane based on the increasing output beam magnification and the nonlinearly increasing output beam displacement.

4. The apparatus of claim 1, wherein the second curvature is hyperbolic concave.

5. The apparatus of claim 1, wherein the first curvature is parabolic convex.

6. The apparatus of claim 1, wherein at least one of the first and second curvatures is aspheric.

7. The apparatus of claim 1, wherein the initial beam displacements correspond to displacements along a common fast axis of the laser beams.

8. The apparatus of claim 7, wherein the first and second curvatures are configured to circularize an ensemble image space and NA space of the laser output beams at an ensemble coupling plane by elongating images at the ensemble coupling plane along the common fast axis for laser diode beams having smaller input beam displacements relative to the optical axis and shortening images at the ensemble coupling plane along the common fast axis for laser diode beams having larger input beam displacements relative to the optical axis.

9. The apparatus of claim 1, wherein the transmissive optical substrate is a cylindrical meniscus lens.

10. The apparatus of claim 9, wherein the cylindrical meniscus lens includes a reference surface extending parallel to the optical axis and cylindrical axes associated with the first and second surfaces.

11. The apparatus of claim 1, wherein the first and second curvatures define a variable curvature ratio between parallel input beam positions and transmitted parallel output beam positions associated with the increased output beam magnification.

12. A method, comprising making a transmissive optical substrate of claim 1.

13. The apparatus of claim 1, wherein the output beam magnification is less than one for each of the laser beams received within an input aperture of the transmissive optical substrate.

14. The apparatus of claim 1, wherein the transmissive optical substrate comprises a cylindrical fast axis telescope.

15. The apparatus of claim 1, wherein the transmissive optical substrate comprises a slow axis telescope.

16. The apparatus of claim 1, wherein the transmissive optical substrate comprises a combined fast and slow axis telescope.

17. A laser diode package, comprising the apparatus of claim 1.

* * * * *